(12) United States Patent
Theeuwes et al.

(10) Patent No.: US 11,733,606 B2
(45) Date of Patent: Aug. 22, 2023

(54) METHOD FOR PERFORMING A MANUFACTURING PROCESS AND ASSOCIATED APPARATUSES

(71) Applicant: ASML NETHERLANDS B.V., Veldhoven (NL)

(72) Inventors: Thomas Theeuwes, Veldhoven (NL); Koenraad Van Ingen Schenau, Veldhoven (NL); Pieter Joseph Marie Wöltgens, Veldhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 57 days.

(21) Appl. No.: 16/972,073

(22) PCT Filed: Apr. 29, 2019

(86) PCT No.: PCT/EP2019/060912
§ 371 (c)(1),
(2) Date: Dec. 4, 2020

(87) PCT Pub. No.: WO2020/001831
PCT Pub. Date: Jan. 2, 2020

(65) Prior Publication Data
US 2021/0240073 A1    Aug. 5, 2021

(30) Foreign Application Priority Data
Jun. 25, 2018 (EP) .................................. 18179450

(51) Int. Cl.
*G03F 1/70* (2012.01)
*G03F 7/20* (2006.01)
*G03F 7/00* (2006.01)

(52) U.S. Cl.
CPC ................ *G03F 1/70* (2013.01); *G03F 7/705* (2013.01); *G03F 7/70283* (2013.01); *G03F 7/70466* (2013.01); *G03F 7/70475* (2013.01)

(58) Field of Classification Search
CPC .......... G03F 1/36; G03F 1/70; G03F 7/70466; G03F 7/70475; G03F 7/70283;
(Continued)

(56) References Cited

U.S. PATENT DOCUMENTS

| 6,251,564 B1 * | 6/2001 | Lin ......................... G03F 7/203 430/22 |
| 6,518,180 B1 * | 2/2003 | Fukuda ..................... G03F 1/26 430/394 |

(Continued)

FOREIGN PATENT DOCUMENTS

| EP | 1804123 | 7/2007 |
| WO | 2009078708 | 6/2009 |

(Continued)

OTHER PUBLICATIONS

International Search Report and Written Opinion issued in corresponding PCT Patent Application No. PCT/EP2019/060912, dated Jun. 12, 2019.

*Primary Examiner* — Christina A Riddle
(74) *Attorney, Agent, or Firm* — Pillsbury Winthrop Shaw Pittman, LLP

(57) ABSTRACT

A method for assigning features into at least first features and second features, the first features being for at least one first patterning device configured for use in a lithographic process to form corresponding first structures on a substrate and the second features being for at least one second patterning device configured for use in a lithographic process to form corresponding second structures on a substrate, wherein the method including assigning the features into the (Continued)

first features and the second features based on a patterning characteristic of the features.

20 Claims, 3 Drawing Sheets

(58) Field of Classification Search
CPC .. G03F 7/705; G03F 7/70325; G03F 7/70375; G03F 7/70412–70541; G03F 7/70616–70683; G03F 7/7055–70583
USPC ........ 355/18, 30, 52–77, 133; 430/5, 22, 30; 716/50–56
See application file for complete search history.

(56) References Cited

U.S. PATENT DOCUMENTS

| | | |
|---|---|---|
| 2003/0039893 A1 | 2/2003 | Farnsworth et al. |
| 2003/0142284 A1 | 7/2003 | Lin |
| 2006/0033921 A1 | 2/2006 | Den Boef et al. |
| 2006/0066855 A1 | 3/2006 | Den Boef et al. |
| 2010/0201963 A1 | 8/2010 | Cramer et al. |
| 2010/0291476 A1 | 11/2010 | Liu |
| 2010/0301457 A1 | 12/2010 | Schroeder |
| 2010/0308439 A1 | 12/2010 | Lee et al. |
| 2011/0027704 A1 | 2/2011 | Cramer et al. |
| 2011/0043791 A1 | 2/2011 | Smilde et al. |
| 2011/0102753 A1 | 5/2011 | Van De Kerkhof et al. |
| 2012/0044470 A1 | 2/2012 | Smilde et al. |
| 2012/0123581 A1 | 5/2012 | Smilde et al. |
| 2013/0258310 A1 | 10/2013 | Smilde et al. |
| 2013/0271740 A1 | 10/2013 | Quintanilha et al. |
| 2014/0244215 A1* | 8/2014 | Nakayama .......... G03F 7/70466 702/189 |
| 2015/0052492 A1 | 2/2015 | Hou et al. |

FOREIGN PATENT DOCUMENTS

| | | |
|---|---|---|
| WO | 2009106279 | 9/2009 |
| WO | 2013178422 | 12/2013 |
| WO | 2016205409 | 12/2016 |

\* cited by examiner

METHOD FOR PERFORMING A MANUFACTURING PROCESS AND ASSOCIATED APPARATUSES

CROSS-REFERENCE TO RELATED APPLICATIONS

This application is the U.S. national phase entry of PCT Patent Application No. PCT/EP2019/060912, which was filed on Apr. 29, 2019, which claims the benefit of priority of European Patent Application No. 18179450.4, which was filed on Jun. 25, 2018 and which is incorporated herein in its entirety by reference.

FIELD OF THE INVENTION

The present invention relates to methods and apparatus for applying patterns to a substrate in a lithographic process.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"–direction) while synchronously scanning the substrate parallel or anti-parallel to this direction. It is also possible to transfer the pattern from the patterning device to the substrate by imprinting the pattern onto the substrate.

In order to monitor the lithographic process, parameters of the patterned substrate are measured. Parameters may include, for example, the overlay error between successive layers formed in or on the patterned substrate and critical linewidth (CD) of developed photosensitive resist. This measurement may be performed on a product substrate and/or on a dedicated metrology target. There are various techniques for making measurements of the microscopic structures formed in lithographic processes, including the use of scanning electron microscopes and various specialized tools. A fast and non-invasive form of specialized inspection tool is a scatterometer in which a beam of radiation is directed onto a target on the surface of the substrate and properties of the scattered or reflected beam are measured. Two main types of scatterometer are known. Spectroscopic scatterometers direct a broadband radiation beam onto the substrate and measure the spectrum (intensity as a function of wavelength) of the radiation scattered into a particular narrow angular range. Angularly resolved scatterometers use a monochromatic radiation beam and measure the intensity of the scattered radiation as a function of angle.

Examples of known scatterometers include angle-resolved scatterometers of the type described in US2006033921A1 and US2010201963A1. The targets used by such scatterometers are relatively large, e.g., 40 µm by 40 µm, gratings and the measurement beam generates a spot that is smaller than the grating (i.e., the grating is underfilled). In addition to measurement of feature shapes by reconstruction, diffraction based overlay can be measured using such apparatus, as described in published patent application US2006066855A1. Diffraction-based overlay metrology using dark-field imaging of the diffraction orders enables overlay measurements on smaller targets. Examples of dark field imaging metrology can be found in international patent applications WO 2009/078708 and WO 2009/106279 which documents are hereby incorporated by reference in their entirety. Further developments of the technique have been described in published patent publications US20110027704A, US20110043791A, US2011102753A1, US20120044470A, US20120123581A, US20130258310A, US20130271740A and WO2013178422A1. These targets can be smaller than the illumination spot and may be surrounded by product structures on a wafer. Multiple gratings can be measured in one image, using a composite grating target. The contents of all these applications are also incorporated herein by reference.

In performing lithographic processes, such as application of a pattern on a substrate or measurement of such a pattern, process control methods are used to monitor and control the process. Such process control techniques are typically performed to obtain corrections for control of the lithographic process. It would be desirable to improve such process control methods.

SUMMARY OF THE INVENTION

In a first aspect of the invention, there is provided a method for assigning features into at least first features and second features, said first features being for at least one first patterning device configured for use in a lithographic process to form corresponding first structures on a substrate and second features being for at least one second patterning device configured for use in a lithographic process to form corresponding second structures on the substrate, wherein said method comprises assigning said features into said first features and said second features based on a patterning characteristic of the features.

In a second aspect of the invention, there is provided a set of patterning devices comprising: at least one first patterning device comprising first features configured for use in a lithographic process to form corresponding first structures on a substrate, wherein the first features comprise a first patterning characteristic; and at least one second patterning device configured for use in a lithographic process to form corresponding second structures on the substrate, wherein the second features comprise a second patterning characteristic; wherein said first features form a first pattern and said second features form a second pattern, said first and second patterns being complementary patterns for forming a layer of a device on the substrate.

In a third aspect of the invention, there is provided a method for arranging features on at least one patterning device configured for use in a process of patterning a substrate, the method comprising: obtaining a process setting for applying structures onto the substrate corresponding to a first set of said features comprised within a region on the at least one patterning device; determining a compatibility of a second set of features with the first set of features based on an expected quality of patterning of the second set of features using the setting of the process; and determining a suitable position of the second set of features on the at least one patterning device based on the determined compatibility.

In a fourth aspect of the invention, there is provided a processing device for determining a correction for control of at least one manufacturing apparatus configured to provide product structures to a substrate in a manufacturing process, the processing device being configured to perform the method of the first aspect.

In a fifth aspect of the invention, there is provided a computer program comprising program instructions operable to perform the method of the first aspect when run on a suitable apparatus.

In a sixth aspect of the invention, there is provided a manufacturing apparatus configured to provide product structures to a substrate in a manufacturing process, said manufacturing apparatus comprising the processing device of the second aspect.

Further aspects, features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example, with reference to the accompanying drawings in which.

DETAILED DESCRIPTION

Before describing embodiments of the invention in detail, it is instructive to present an example environment in which embodiments of the present invention may be implemented.

Figure 1:
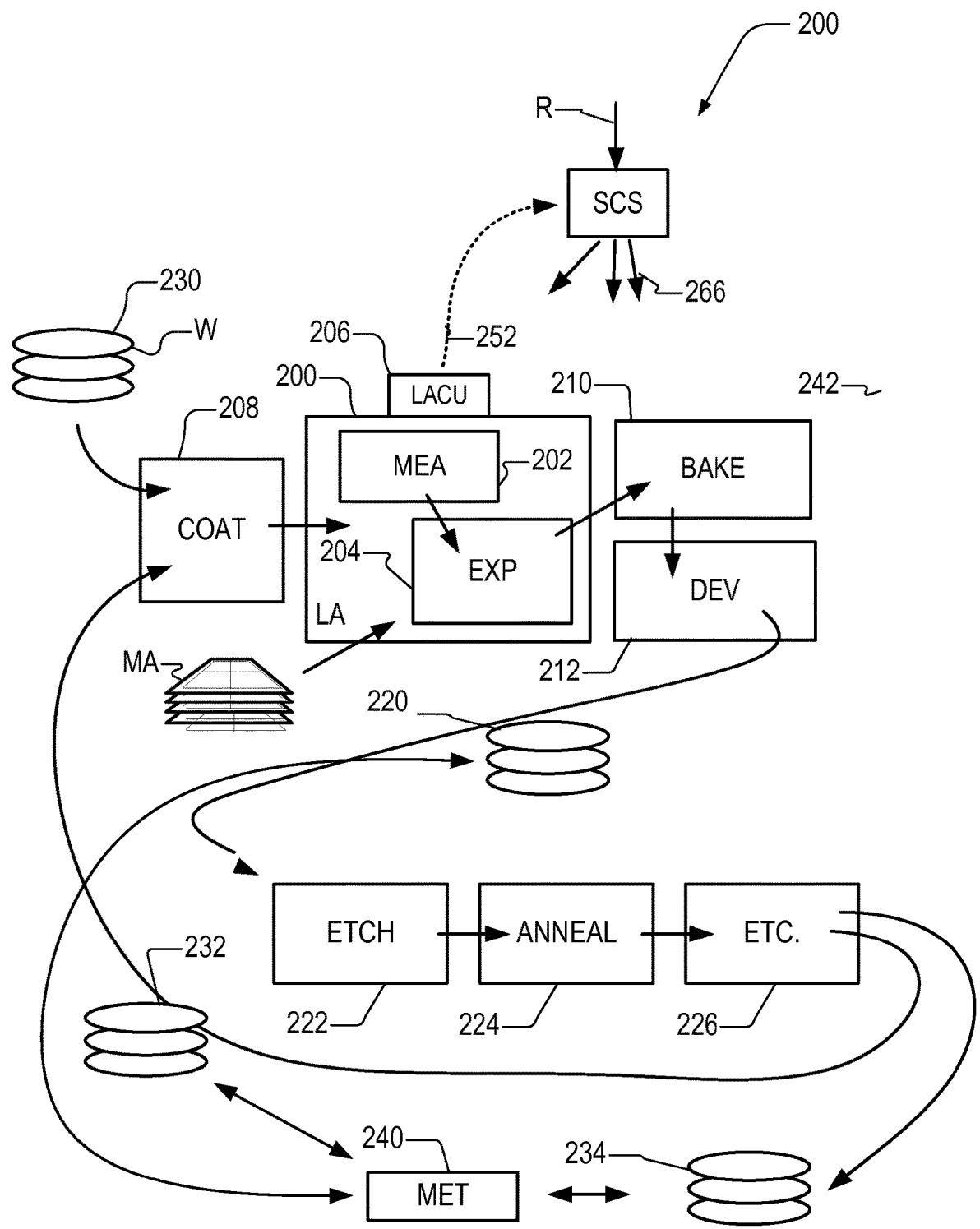
FIG. 1 depicts a lithographic apparatus together with other apparatuses forming a production facility for semiconductor devices.

FIG. 1 at 200 shows a lithographic apparatus LA as part of an industrial production facility implementing a high-volume, lithographic manufacturing process. In the present example, the manufacturing process is adapted for the manufacture of for semiconductor products (integrated circuits) on substrates such as semiconductor wafers. The skilled person will appreciate that a wide variety of products can be manufactured by processing different types of substrates in variants of this process. The production of semiconductor products is used purely as an example which has great commercial significance today.

Within the lithographic apparatus (or "litho tool" 200 for short), a measurement station MEA is shown at 202 and an exposure station EXP is shown at 204. A control unit LACU is shown at 206. In this example, each substrate visits the measurement station and the exposure station to have a pattern applied. In an optical lithographic apparatus, for example, a projection system is used to transfer a product pattern from a patterning device MA onto the substrate using conditioned radiation and a projection system. This is done by forming an image of the pattern in a layer of radiation-sensitive resist material.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. The patterning MA device may be a mask or reticle, which imparts a pattern to a radiation beam transmitted or reflected by the patterning device. Well-known modes of operation include a stepping mode and a scanning mode. As is well known, the projection system may cooperate with support and positioning systems for the substrate and the patterning device in a variety of ways to apply a desired pattern to many target portions across a substrate. Programmable patterning devices may be used instead of reticles having a fixed pattern. The radiation for example may include electromagnetic radiation in the deep ultraviolet (DUV) or extreme ultraviolet (EUV) wavebands. The present disclosure is also applicable to other types of lithographic process, for example imprint lithography and direct writing lithography, for example by electron beam.

The lithographic apparatus control unit LACU which controls all the movements and measurements of various actuators and sensors to receive substrates W and reticles MA and to implement the patterning operations. LACU also includes signal processing and data processing capacity to implement desired calculations relevant to the operation of the apparatus. In practice, control unit LACU will be realized as a system of many sub-units, each handling the real-time data acquisition, processing and control of a subsystem or component within the apparatus.

Before the pattern is applied to a substrate at the exposure station EXP, the substrate is processed in at the measurement station MEA so that various preparatory steps may be carried out. The preparatory steps may include mapping the surface height of the substrate using a level sensor and measuring the position of alignment marks on the substrate using an alignment sensor. The alignment marks are arranged nominally in a regular grid pattern. However, due to inaccuracies in creating the marks and also due to deformations of the substrate that occur throughout its processing, the marks deviate from the ideal grid. Consequently, in addition to measuring position and orientation of the substrate, the alignment sensor in practice must measure in detail the positions of many marks across the substrate area, if the apparatus is to print product features at the correct locations with very high accuracy. The apparatus may be of a so-called dual stage type which has two substrate tables, each with a positioning system controlled by the control unit LACU. While one substrate on one substrate table is being exposed at the exposure station EXP, another substrate can be loaded onto the other substrate table at the measurement station MEA so that various preparatory steps may be carried out. The measurement of alignment marks is therefore very time-consuming and the provision of two substrate tables enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations. Lithographic apparatus LA may for example is of a so-called dual stage type which has two substrate tables and two stations—an exposure station and a measurement station—between which the substrate tables can be exchanged.

Within the production facility, apparatus 200 forms part of a "litho cell" or "litho cluster" that contains also a coating apparatus 208 for applying photosensitive resist and other coatings to substrates W for patterning by the apparatus 200. At an output side of apparatus 200, a baking apparatus 210 and developing apparatus 212 are provided for developing the exposed pattern into a physical resist pattern. Between all of these apparatuses, substrate handling systems take care of supporting the substrates and transferring them from one piece of apparatus to the next. These apparatuses, which are often collectively referred to as the track, are under the control of a track control unit which is itself controlled by a supervisory control system SCS, which also controls the lithographic apparatus via lithographic apparatus control unit LACU. Thus, the different apparatus can be operated to maximize throughput and processing efficiency. Supervisory control system SCS receives recipe information R which provides in great detail a definition of the steps to be performed to create each patterned substrate.

Once the pattern has been applied and developed in the litho cell, patterned substrates 220 are transferred to other processing apparatuses such as are illustrated at 222, 224, 226. A wide range of processing steps is implemented by various apparatuses in a typical manufacturing facility. For the sake of example, apparatus 222 in this embodiment is an etching station, and apparatus 224 performs a post-etch annealing step. Further physical and/or chemical processing steps are applied in further apparatuses, 226, etc. Numerous types of operation can be required to make a real device, such as deposition of material, modification of surface material characteristics (oxidation, doping, ion implantation etc.), chemical-mechanical polishing (CMP), and so forth. The apparatus 226 may, in practice, represent a series of different processing steps performed in one or more apparatuses. As another example, apparatus and processing steps may be provided for the implementation of self-aligned multiple patterning, to produce multiple smaller features based on a precursor pattern laid down by the lithographic apparatus.

As is well known, the manufacture of semiconductor devices involves many repetitions of such processing, to build up device structures with appropriate materials and patterns, layer-by-layer on the substrate. Accordingly, substrates 230 arriving at the litho cluster may be newly prepared substrates, or they may be substrates that have been processed previously in this cluster or in another apparatus entirely. Similarly, depending on the required processing, substrates 232 on leaving apparatus 226 may be returned for a subsequent patterning operation in the same litho cluster, they may be destined for patterning operations in a different cluster, or they may be finished products to be sent for dicing and packaging.

Each layer of the product structure requires a different set of process steps, and the apparatuses 226 used at each layer may be completely different in type. Further, even where the processing steps to be applied by the apparatus 226 are nominally the same, in a large facility, there may be several supposedly identical machines working in parallel to perform the step 226 on different substrates. Small differences in set-up or faults between these machines can mean that they influence different substrates in different ways. Even steps that are relatively common to each layer, such as etching (apparatus 222) may be implemented by several etching apparatuses that are nominally identical but working in parallel to maximize throughput. In practice, moreover, different layers require different etch processes, for example chemical etches, plasma etches, according to the details of the material to be etched, and special requirements such as, for example, anisotropic etching.

The previous and/or subsequent processes may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a 'dry' tool. Some layers may be exposed in a tool working at DUV wavelengths, while others are exposed using EUV wavelength radiation.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. Accordingly a manufacturing facility in which litho cell LC is located also includes metrology system which receives some or all of the substrates W that have been processed in the litho cell. Metrology results are provided directly or indirectly to the supervisory control system SCS. If errors are detected, adjustments may be made to exposures of subsequent substrates, especially if the metrology can be done soon and fast enough that other substrates of the same batch are still to be exposed. Also, already exposed substrates may be stripped and reworked to improve yield, or discarded, thereby avoiding performing further processing on substrates that are known to be faulty. In a case where only some target portions of a substrate are faulty, further exposures can be performed only on those target portions which are good.

Also shown in FIG. 1 is a metrology apparatus 240 which is provided for making measurements of parameters of the products at desired stages in the manufacturing process. A common example of a metrology station in a modem lithographic production facility is a scatterometer, for example a dark-field scatterometer, an angle-resolved scatterometer or a spectroscopic scatterometer, and it may be applied to measure properties of the developed substrates at 220 prior to etching in the apparatus 222. Using metrology apparatus 240, it may be determined, for example, that important performance parameters such as overlay or critical dimension (CD) do not meet specified accuracy requirements in the developed resist. Prior to the etching step, the opportunity exists to strip the developed resist and reprocess the substrates 220 through the litho cluster. The metrology results 242 from the apparatus 240 can be used to maintain accurate performance of the patterning operations in the litho cluster, by supervisory control system SCS and/or control unit LACU 206 making small adjustments over time, thereby minimizing the risk of products being made out-of-specification, and requiring re-work.

Additionally, metrology apparatus 240 and/or other metrology apparatuses (not shown) can be applied to measure properties of the processed substrates 232, 234, and incoming substrates 230. The metrology apparatus can be used on the processed substrate to determine important parameters such as overlay or CD.

A metrology apparatus suitable for use in embodiments of the invention is shown in FIG. 2(a). This is purely an example metrology apparatus and any suitable metrology apparatus for measuring a process parameter such as overlay on a substrate may be used. A target T and diffracted rays of measurement radiation used to illuminate the target are illustrated in more detail in FIG. 2(b). The metrology apparatus illustrated is of a type known as a dark field metrology apparatus. The metrology apparatus may be a stand-alone device or incorporated in either the lithographic apparatus LA, e.g., at the measurement station, or the lithographic cell LC. An optical axis, which has several branches throughout the apparatus, is represented by a dotted line O. In this apparatus, light emitted by source 11 (e.g., a xenon lamp) is directed onto substrate W via a beam splitter 15 by an optical system comprising lenses 12, 14 and objective lens 16. These lenses are arranged in a double sequence of a 4F arrangement. A different lens arrangement can be used, provided that it still provides a substrate image onto a detector, and simultaneously allows for access of an intermediate pupil-plane for spatial-frequency filtering. Therefore, the angular range at which the radiation is incident on the substrate can be selected by defining a spatial intensity distribution in a plane that presents the spatial spectrum of the substrate plane, here referred to as a (conjugate) pupil plane. In particular, this can be done by inserting an aperture plate 13 of suitable form between lenses 12 and 14, in a plane which is a back-projected image of the objective lens pupil plane. In the example illustrated, aperture plate 13 has different forms, labeled 13N and 13S, allowing different illumination modes to be selected. The illumination system in the present examples forms an off-axis illumination mode. In the first illumination mode, aperture plate 13N provides off-axis from a direction designated, for the sake of description only, as 'north'. In a second illumination mode, aperture plate 13S is used to provide similar illumination, but from an opposite direction, labeled 'south'. Other modes of illumination are possible by using different apertures. The rest of the pupil plane is desirably dark as any unnecessary light outside the desired illumination mode will interfere with the desired measurement signals.

As shown in FIG. 2(b), target T is placed with substrate W normal to the optical axis O of objective lens 16. The substrate W may be supported by a support (not shown). A ray of measurement radiation I impinging on target T from an angle off the axis O gives rise to a zeroth order ray (solid line 0) and two first order rays (dot-chain line +1 and double dot-chain line −1). It should be remembered that with an overfilled small target, these rays are just one of many parallel rays covering the area of the substrate including metrology target T and other features. Since the aperture in plate 13 has a finite width (necessary to admit a useful quantity of light, the incident rays I will in fact occupy a range of angles, and the diffracted rays 0 and +1/−1 will be spread out somewhat. According to the point spread function of a small target, each order +1 and −1 will be further spread over a range of angles, not a single ideal ray as shown. Note that the grating pitches of the targets and the illumination angles can be designed or adjusted so that the first order rays entering the objective lens are closely aligned with the central optical axis. The rays illustrated in FIGS. 2(a) and 2(b) are shown somewhat off axis, purely to enable them to be more easily distinguished in the diagram.

At least the 0 and +1 orders diffracted by the target T on substrate W are collected by objective lens 16 and directed back through beam splitter 15. Returning to FIG. 2(a), both the first and second illumination modes are illustrated, by designating diametrically opposite apertures labeled as north (N) and south (S). When the incident ray I of measurement radiation is from the north side of the optical axis, that is when the first illumination mode is applied using aperture plate 13N, the +1 diffracted rays, which are labeled +1(N), enter the objective lens 16. In contrast, when the second illumination mode is applied using aperture plate 13S the −1 diffracted rays (labeled −1(S)) are the ones which enter the lens 16.

A second beam splitter 17 divides the diffracted beams into two measurement branches. In a first measurement branch, optical system 18 forms a diffraction spectrum (pupil plane image) of the target on first sensor 19 (e.g. a CCD or CMOS sensor) using the zeroth and first order diffractive beams. Each diffraction order hits a different point on the sensor, so that image processing can compare and contrast orders. The pupil plane image captured by sensor 19 can be used for many measurement purposes such as reconstruction used in methods described herein. The pupil plane image can also be used for focusing the metrology apparatus and/or normalizing intensity measurements of the first order beam.

In the second measurement branch, optical system 20, 22 forms an image of the target T on sensor 23 (e.g. a CCD or CMOS sensor). In the second measurement branch, an aperture stop 21 is provided in a plane that is conjugate to the pupil-plane. Aperture stop 21 functions to block the zeroth order diffracted beam so that the image of the target formed on sensor 23 is formed only from the −1 or +1 first order beam. The images captured by sensors 19 and 23 are output to processor PU which processes the image, the function of which will depend on the particular type of measurements being performed. Note that the term 'image' is used here in a broad sense. An image of the grating lines as such will not be formed, if only one of the −1 and +1 orders is present.

Figure 2:
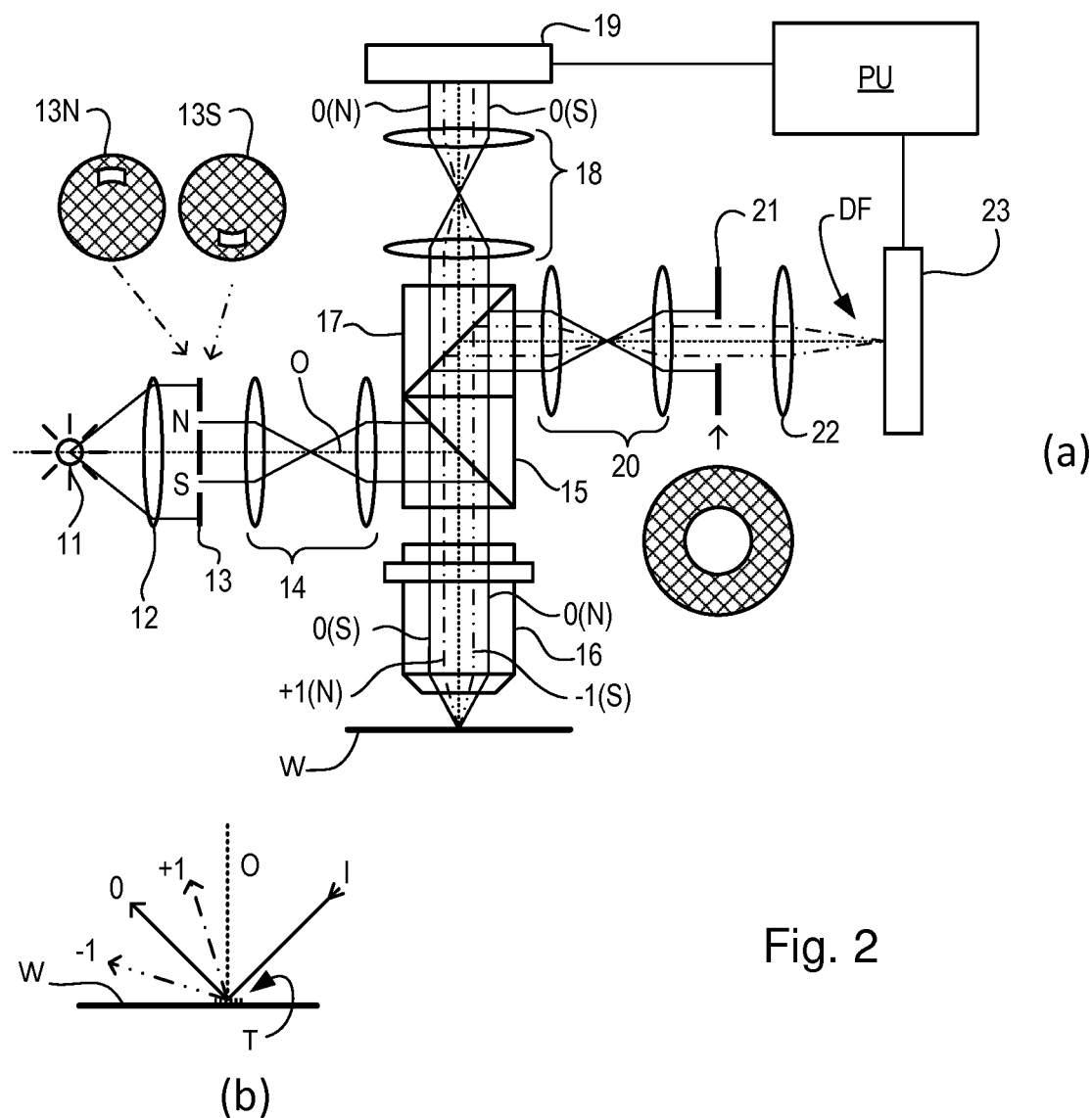
FIG. 2 comprises a schematic diagram of a scatterometer for use in measuring targets according to embodiments of the invention.

The particular forms of aperture plate 13 and field stop 21 shown in FIG. 2 are purely examples. In another embodiment of the invention, on-axis illumination of the targets is used and an aperture stop with an off-axis aperture is used to pass substantially only one first order of diffracted light to the sensor. In yet other embodiments, $2^{nd}$, $3^{rd}$ and higher order beams (not shown in FIG. 2) can be used in measurements, instead of or in addition to the first order beams.

The target T may comprise a number of gratings, which may have differently biased overlay offsets in order to facilitate measurement of overlay between the layers in which the different parts of the composite gratings are formed. The gratings may also differ in their orientation, so as to diffract incoming radiation in X and Y directions. In one example, a target may comprise two X-direction gratings with biased overlay offsets +d and −d, and Y-direction gratings with biased overlay offsets +d and −d. Separate images of these gratings can be identified in the image captured by sensor 23. Once the separate images of the gratings have been identified, the intensities of those individual images can be measured, e.g., by averaging or summing selected pixel intensity values within the identified areas. Intensities and/or other properties of the images can be compared with one another. These results can be combined to measure different parameters of the lithographic process Full field integrated circuit (IC) devices comprise multiple functional blocks or sub-regions having different characteristics and therefore different exposure requirements. For example, an IC comprising a central processing unit (CPU)

and on-chip memory or graphical processing units (GPUs) may be formed in a single exposure per layer. However, the logic sub-regions, memory sub-regions and/or GPU sub-regions of such an IC each define different functional sub-regions and have quite different characteristics. In particular, memory sub-regions (e.g., static random access memory—SRAM) or GPU sub-regions tend to comprise highly regular patterns having a uniform pitch, while logic sub-regions tend to comprise irregular patterns having various pitches.

The memory sub-regions, and other more regular sub-regions, when exposed on their own, can take advantage of particular exposure modes and settings (for example, particular illumination modes) which enable improved scaling of these sub-regions (e.g., making these sub-regions smaller on the substrate by increasing device density). However, when exposed alongside logic sub-regions in a single exposure, the more stringent requirements for exposure of the logic sub-regions limit the exposure modes and settings to those which are more conventional, to ensure that the logic areas function correctly and the die will be yielding. This in turn imposes a limit on the achievable scaling of the memory sub-regions, and as such means that the optimal scaling will not be achieved such that the IC will occupy more area on the substrate than necessary.

It is therefore proposed to manufacture such devices in two or more patterning steps (e.g., exposures) for at least one layer (i.e., per applicable layer) on two or more sub-fields which together make up the full field (i.e., one layer of the full die). The term "field" or "full field" simply refers to any region on the substrate on which product structures are being formed (in particular, over multiple exposures) in an IC manufacturing process, and as such may comprise two or more adjacent sub-fields (i.e., "stitched" sub-fields exposed adjacently on the substrate). The different functional sub-regions (e.g., cache, logic, GPU, CPU, AI, metrology targets) are divided (e.g., into two categories) between the sub-fields such that different (e.g., optimized) exposure modes and/or settings can be used for the different sub-field exposures as appropriate.

The two sub-fields may be substantially non-overlapping, i.e., they may not overlap at all, or else have a small overlap in the stitching boundary area to accommodate stitched targets. A stitched target may comprise a first half of an overlay-like target on the first sub-field (e.g., patterned from the first reticle) and a second (complementary) half of the overlay-like target on the second sub-field (e.g., patterned from the second reticle). The relative positioning of the complementary patterns can then be measured to provide a measure of the relative positioning of the two sub-fields.

As such, disclosed herein is a method of performing a lithographic process to form structures on a substrate within a field on said substrate, said field comprising at least a first sub-field and second sub-field, said method comprising: forming first structures (e.g., arranged in first functional sub-regions) in a layer on the first sub-field in a first patterning process; and forming second structures (e.g., arranged in second functional sub-regions) in said layer on the second sub-field in a second patterning process; wherein at least one process setting is varied between the first patterning process and second patterning process. Note that each of the first and second patterning processes may be formed via a double (or multiple) patterning process and comprise more than one exposure and/or etch steps (e.g., one or more of the sub-regions may be formed in a litho-etch-lito etch (LELE) process. It is envisaged that a patterning process in this context may comprise any number of LE steps.

To enable such an approach, there are a number of considerations which may be taken into account. The primary consideration is the proper arrangement of the functional areas on the reticles used for the exposures. Therefore, a proposed method may comprise dividing the different functional sub-regions divided between the reticles based on a respective patterning characteristic of each sub-region. The patterning characteristic may be based on their functional type or structure and therefore their expected quality of patterning (e.g., exposure quality) and exposure requirements. The expected quality of patterning may, for example, be the expected quality of the structure of the sub-regions when exposed with a particular process setting. The expected quality of patterning may be quantified in terms of meeting one or more criterion for one or more of process parameters such as: overlay, edge placement error (EPE), critical dimension uniformity (CDU), contrast. In particular, it should be determined that the quality of patterning will be sufficient for the die to be yielding (functioning) taking into account the respective process setting for exposing each sub-field.

For example, a first patterning process or exposure may be performed using at least one first reticle with first patterns for (e.g., irregular or relatively less regular) first functional sub-regions such as logic sub-regions and a second patterning process or exposure may be performed using at least one second reticle with second patterns for (e.g., regular or relatively more regular) second functional sub-regions such as memory sub-regions/GPU sub-regions or metrology targets etc. Such an arrangement, therefore, may result in the exposed field (layer) being divided into distinct sub-fields (e.g., distinct half-fields assuming two exposures), each sub-field comprising functional sub-regions with shared characteristics; for example functional sub-regions comprising regular patterns versus functional sub-regions irregular patterns. Because of the regularity of the second functional sub-regions, an expected quality of patterning may be acceptable using a process setting (e.g., illumination mode) which enables denser scaling of the structures when exposing the second sub-field compared to that possible when exposing the first sub-field. Note that for LELE processes, there may be more than one first reticle each having complementary patterns to form the first sub-field and/or more than one second reticle to form the second sub-field in a double or multiple patterning process.

The assignment of functional sub-regions to one category (reticle) or another may be based on the functional type of the functional sub-region (i.e., is it memory/GPU or logic/CPU). Alternatively or in addition, this assignment may be based on an assessment of the regularity of the pattern corresponding to the functional sub-region. Alternatively or in addition, assignment of the functional sub-regions between reticles may be based on a more rigorous assessment, for example, based on a simulation of the patterning on the substrate (e.g., under different process settings), or based on imposed design rules for a particular sub-region. In this way, the process setting(s) can be optimized individually for each sub-field of a stitched die.

Figure 3:
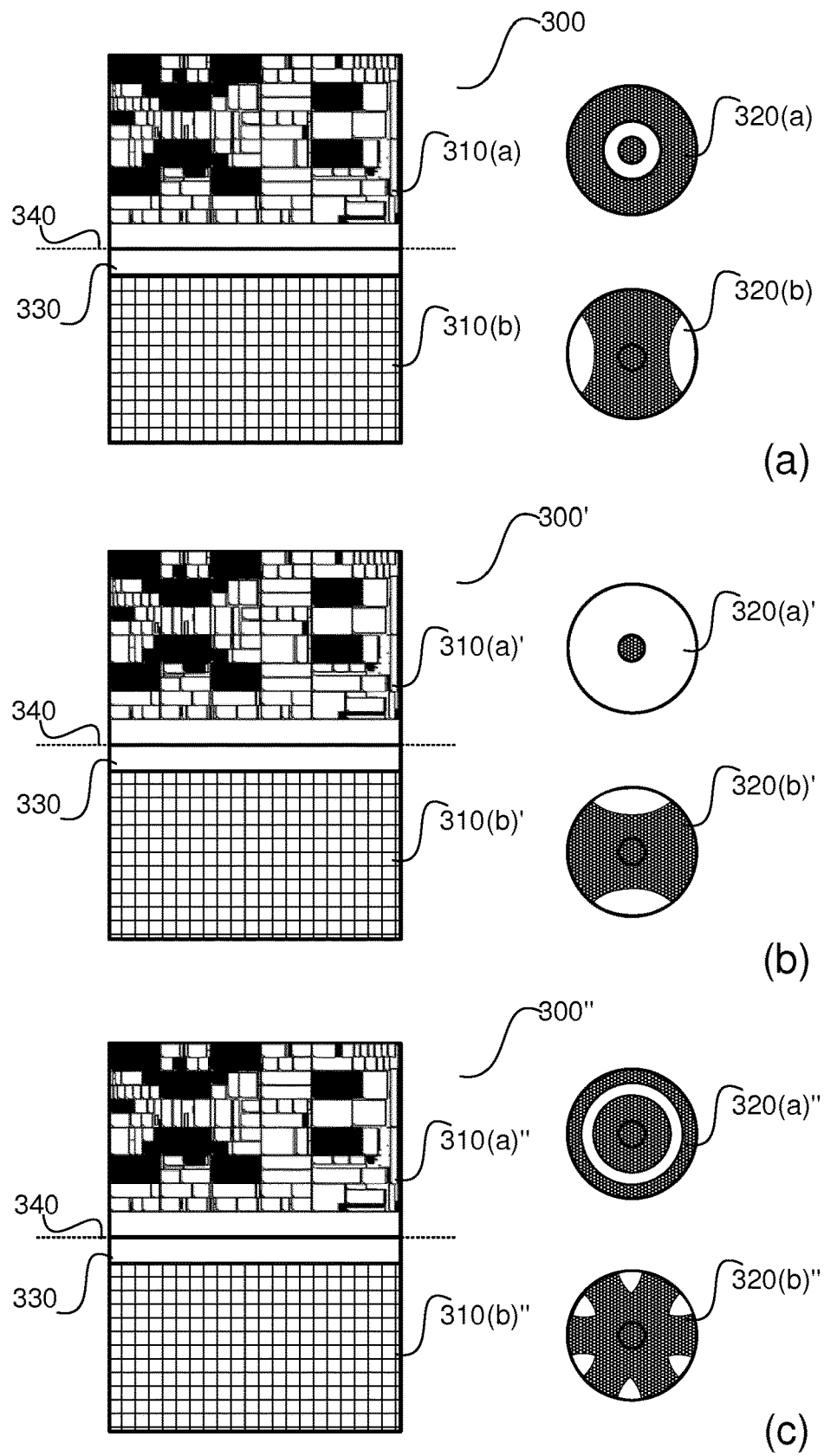
FIG. 3 comprises three exemplary full-field arrangements, each comprising two sub-fields and a corresponding illumination profile for exposing each of the sub-fields.

FIG. 3 shows a number of examples of a field 300, 300', 300" exposed according to such a method. FIG. 3(*a*), for example, shows a field 300 comprising (e.g., one layer of) a single die. A first sub-field 310(*a*) comprises CPU circuitry which is largely irregular. A second sub-field 310(*b*) comprise GPU circuitry having largely regular, repeating patterns. The first sub-field 310(*a*) is exposed using a first illumination profile 320(*a*) (e.g., annular) optimized for the irregular pattern. The second sub-field 310(*b*) is exposed using a second illumination profile 320(*b*) optimized for the regular pattern (e.g., enabling a greater product density than for said first sub-field 310(*a*), due to the lower complexity of the image being exposed there). FIG. 3(*b*) shows a field 300' comprising first sub-field 310(*a*)' having functional sub-regions of logic circuitry (largely irregular) and a second sub-field 310(*b*)' comprising SRAM (regular). The first sub-field 310(*a*)' is exposed using a first illumination profile 320(*a*)' optimized for the logic circuitry and the second sub-field 310(*b*)' is exposed using a second illumination profile 320(*b*)' optimized for the SRAM. FIG. 3(*c*) shows a field 300" comprising first sub-field 310(*a*)" having functional sub-regions of CPU circuitry (largely irregular) and a second sub-field 310(*b*)" comprising AI (e.g., neural network) circuitry (very regular). The first sub-field 310(*a*)" is exposed using a first illumination profile 320(*a*)" optimized for the CPU circuitry and the second sub-field 310(*b*)" is exposed using a second illumination profile 320(*b*)" optimized for the AI circuitry.

Also disclosed is a method for distributing sets of features across a plurality of patterning devices used in a process of stitched patterning of a first layer on a substrate. The method comprises:
  defining a first boundary area on a first patterning device configured to be imaged to form corresponding first structures in a first layer on the substrate;
  distributing first features for forming the first structures on the first patterning device outside of the first boundary area,
  defining a second boundary area on a second patterning device configured to be imaged to form corresponding second structures in the first layer on the substrate;
  distributing second features for forming the second structures on the second patterning device outside of the second boundary area,
  distributing third features on a third patterning device, said third features configured to be imaged to form electrical connections on the substrate in a second layer which connect said first structures to said second structures.

Such a method may comprise optimally arranging the first features, second features and third features on their respective patterning devices, e.g., in terms of functionality, exposure routing and/or maximizing product density. As before, there may be more than one first patterning device with complementary patterns for a multiple patterning process, and similarly more than one second and third patterning devices.

The example of FIG. 3 shows such a boundary area 330 (i.e., either side of stitching boundary 340 dividing the two sub-fields). The boundary area 330 may be maintained clear or relatively clear of structures (e.g., the functional sub-regions are arranged outside of the boundary area). In particular, it is proposed that circuitry within the two sub-fields are not necessarily connected in the same layer, but rather some or all connections are made in another, connecting layer (e.g., based on a separate exposure using one or more additional reticles. In particular, those connections critical for non-correctable proximity errors (e.g., induced by the other exposure) should not be placed in the boundary area, with only less critical connections placed there.

The proposed connecting layer (which may comprise other product structures etc.) may be exposed in a single exposure, or (if not) using the same illumination such that the connections are formed correctly. As such, a method of dividing the functional sub-regions between reticles may also comprise dividing patterns to connect the first functional sub-regions of the first sub-field and the second functional sub-regions of the second sub-field, into a reticle for exposure of a different layer. For example, irregular functional sub-regions may be assigned to at least one first reticle for the first sub-field, regular functional sub-regions may be assigned to at least one second reticle for the second sub-field, and connections between the irregular functional sub-regions and regular functional sub-regions assigned to a different layer exposed using at least one third reticle. The third layer may also be formed in more than one exposure, e.g., using a double patterning process.

The above example shows different pupil illumination modes for exposing the different sub-fields. However, it should be appreciated that any aspect of the exposure process, including control or monitoring thereof, can be varied/optimized for between the different sub-fields. For example, one or more of the pupil or polarization mode, the focus or dose settings, etch parameter settings, post bake parameters settings, metrology parameter settings (e.g., for alignment, post-exposure or post-processing metrology) may be optimized. For example, the alignment sensor wavelength or metrology recipe for post-exposure metrology may be optimized per sub-field.

As such, there may be different control loops per exposure, each based on its own estimation/modeling and/or optimization per exposure. Additionally, metrology data may also be divided according to which sub-field it corresponds, such that each control loop is based only on metrology data from its corresponding sub-field. In an embodiment, the metrology strategies may also be defined per sub-field. For example, where a sub-field comprises functional sub-regions which will generally be yielding over a large value range for a particular process parameter, then metrology for that process parameter (and targets therefor) may be dispensed with altogether. By way of an explicit example, where functional sub-regions are known to have a high depth-of-focus (i.e., they will generally be yielding for a large focus range), then focus targets and focus metrology may be dispensed with altogether for the sub-field, or only a very few targets measured. Similarly, fewer metrology targets (less dense metrology) may be performed on sub-fields where there is expected to be little intra-sub-field variation in the process parameter being measured/controlled and/or a control strategy may be employed based on a relatively simple (e.g., linear) model, compared to sub-fields which show greater intra-sub-field variation for that process parameter.

It is also proposed that, in an embodiment, optical proximity correction (OPC) techniques/strategies be optimized per sub-field. In such an embodiment, OPC strategy may be optimized for the illumination condition and/or correction strategy and/or metrology strategy used for exposure of each sub-field.

In an embodiment, the exposure routing of the functional sub-regions and sub-fields may be optimized for maximal throughput (e.g., so as to minimize overhead such as the number of reticle exchanges, illumination switches and the switch times), and to potentially also minimize the lens/wafer heating impact. Such a method may comprise:
  obtaining a process setting for applying structures onto the substrate corresponding to a first set of said features comprised within a region on the patterning device;
  determining a compatibility of a second set of features with the first set of features based on an expected quality of patterning of the second set of features using the setting of the process; and determining a suitable position of the second set of features on the patterning device based on the determined compatibility.

As such, the method may comprise optimizing the arrangement of the sub-regions on each reticle (following assignment of the sub-regions to different reticles) to maximize throughput. The optimization is based on the respective process setting for exposure of that reticle and therefore the corresponding expected quality of patterning. In addition, the assessment may be based on necessary, imposed, or preferred control characteristics for a sub-region (e.g., hardware characteristic such as the slit length, or software characteristics such as dose control to OPC).

By using a method as disclosed herein, more product structures can be fitted onto a single device. In particular, more memory or GPUs can be fitted onto a single device, because more aggressively scaled sub-regions can be exposed. This in turn means that the device area can be shrunk enabling more devices per wafer to be printed. Such an approach may be particularly beneficial for (e.g., EUV) high NA systems which have smaller fields than more conventional systems. For such systems, the field tends to require dividing between stitched exposures in any case, as the required full field area is greater than the maximum scanning area. Therefore, there would be no significant additional overhead in performing this method. For such systems, it may be that the sub-field area comprises the maximum scanning area of the system.

Further embodiments of the invention are disclosed in the list of numbered embodiments below:

1. A method of performing a lithographic process to form structures on a substrate within a field on said substrate, said field comprising at least a first sub-field and second sub-field, said method comprising:

forming first structures in a first layer on the first sub-field in a first patterning process; and forming second structures in said first layer on the second sub-field in a second patterning process;

wherein at least one process setting is varied between the first patterning process and second patterning process.

2. A method according to embodiment 1, wherein first sub-field and second sub-field comprise substantially adjacent sub-fields.

3. A method according to embodiment 1 or 2, wherein said first structures comprise a first patterning characteristic and said second structures comprise a second patterning characteristic, said first patterning characteristic being distinct from said second patterning characteristic.

4. A method according to embodiment 3, wherein said first patterning characteristic relates to an expected quality of patterning of the first structures following said first patterning process and said second patterning characteristic relates to an expected quality of patterning of the second structures following said second patterning process.

5. A method according to embodiment 3 or 4, wherein said first patterning characteristic relates to the degree of regularity of the first structures and said second patterning characteristic relates to the degree of regularity of the second structures.

6. A method according to embodiment 3, 4 or 5, wherein the first structures are arranged in one or more first functional sub-regions, and said second structures are arranged in one or more second functional sub-regions, said functional sub-regions being differentiated by their intended function.

7. A method according to embodiment 6, wherein said first functional sub-regions comprise memory and/or graphical processing unit circuitry and said second functional sub-regions comprise logic and/or central processing unit circuitry.

8. A method according to any preceding embodiment, wherein the at least one process setting relates to an illumination and/or patterning process setting.

9. A method according to embodiment 8, wherein an illumination and/or patterning process setting comprises one or more of an illumination profile, a polarization setting, a focus setting, a dose setting, an etch control setting, and/or a post exposure bake setting.

10. A method according to embodiment 8 or 9, wherein the at least one process setting relates to a monitoring and/or control setting.

11. A method according to any of embodiments 8 to 10, wherein the at least one process setting relates to one or more of an alignment sensor setting, a metrology strategy, a metrology setting, a control model, an optical processing control setting.

12. A method according to any preceding embodiment, wherein said first patterning process is performed using at least one first patterning device and said second patterning process is formed using at least one second patterning device.

13. A method according to embodiment 12, wherein the arrangement of the first structures on said at least one first patterning device and the arrangement of the second structures on said at least one second patterning device are optimized for maximal throughput of the lithographic process.

14. A method according to any preceding embodiment, wherein there is provided a boundary region either side of a boundary dividing the first sub-field and second sub-field; and said steps of forming said first structures and forming said second structures avoids forming structures in said boundary area.

15. A method according to embodiment 14, comprising forming connections between at least some of said first structures to at least some of said second structures in a third patterning process of a second layer.

16. A method for assigning features into at least first features and second features, said first features being for at least one first patterning device configured for use in a lithographic process to form corresponding first structures on a substrate and second features being for at least one second patterning device configured for use in a lithographic process to form corresponding second structures on a substrate, wherein said method comprises assigning said features into said first features and said second features based on a patterning characteristic of the features.

17. A method according to embodiment 16, wherein said patterning characteristic relates to an expected quality of patterning of the first structures and the second structures based on a corresponding process setting.

18. A method according to embodiment 17, comprising performing an assessment of the expected quality of patterning of the first structures and the second structures based on a corresponding process setting; and performing the assignment of said features based on said assessment.

19. A method according to embodiment 18, wherein the step of performing an assessment comprises simulating patterning of the first structures and the second structures onto a substrate.

20. A method according to embodiment 18 or 19, wherein said assessment is based on imposed design rules for the first features and second features.

21. A method according to embodiment 18 to 20, wherein said assessment is based on the degree of regularity of subsets of the features.

22. A method according to any of embodiments 17 to 21, wherein the process setting relates to an illumination and/or a patterning process setting.

23. A method according to embodiment 18, wherein an illumination and/or patterning process setting comprises one or more of an illumination profile, a polarization setting, a focus setting, a dose setting, an etch setting and a post-bake exposure setting.

24. A method according to any of embodiments 17 to 23, wherein the process setting relates to a monitoring and/or control setting.

25. A method according to any of embodiments 17 to 24, wherein the process setting relates to one or more of an alignment sensor setting, a metrology strategy, a metrology setting, a control model, an optical processing control setting.

26. A method according to any of embodiments 16 to 25, comprising arranging the first features on said at least one first patterning device in one or more first functional sub-regions, and the second features on said at least one second patterning device in one or more second functional sub-regions, said functional sub-regions being differentiated by their intended function.

27. A method according to embodiment 26, wherein said first functional sub-regions relate to memory or graphical processing unit circuitry and said second functional sub-regions relate to logic or central processing unit circuitry.

28. A method according to any of embodiments 16 to 27, comprising arranging said first features on said first patterning device outside of a boundary region defined along a boundary of the first patterning device and arranging said second features on said second patterning device outside of boundary region defined along a boundary of the second patterning device.

29. A method according to any of embodiments 16 to 28, comprising forming structures on a substrate within a field on said substrate, said field comprising at least a first sub-field and second sub-field, said method comprising:

using said at least one first patterning device to form first structures in a first layer on the first sub-field in a first patterning process; and using said at least one second patterning device to form second structures in said first layer on the second sub-field in a second patterning process;

wherein at least one process setting is varied between the first patterning process and second patterning process; and wherein the first sub-field and second sub-field comprise substantially adjacent sub-fields.

30. A set of patterning devices comprising:

at least one first patterning device comprising first features configured for use in a lithographic process to form corresponding first structures on a substrate, wherein the first features comprise a first patterning characteristic; and at least one second patterning device configured for use in a lithographic process to form corresponding second structures on a substrate, wherein the second features comprise a second patterning characteristic;

wherein said first features form a first pattern and said second features form a second pattern, said first and second patterns being complementary patterns for forming a layer of a device.

31. A set of patterning devices according to embodiment 30, wherein said patterning characteristic relates to an expected quality of patterning of the first structures and the second structures based on a corresponding process setting.

32. A set of patterning devices according to embodiment 31, wherein the process setting relates to an illumination and/or patterning step setting.

33. A set of patterning devices according to embodiment 32, wherein an illumination and/or patterning step setting comprises one or more of an illumination profile, a polarization setting, a focus setting or a dose setting.

34. A set of patterning devices according to embodiment 31, 32 or 33, wherein the process setting relates to a monitoring and/or control setting.

35. A set of patterning devices according to any of embodiments 31 to 34, wherein the process setting relates to one or more of an alignment sensor setting, a metrology strategy, a metrology setting, a control model, an optical processing control setting.

36. A set of patterning devices according to any of embodiments 30 to 35, wherein said patterning characteristic relates to the degree of regularity of the features.

37. A set of patterning devices according to any of embodiments 30 to 36, wherein the first features on said at least one first patterning device are arranged in one or more first functional sub-regions, and the second features on said at least one second patterning device are arranged in one or more second functional sub-regions, said functional sub-regions being differentiated by their intended function.

38. A set of patterning devices according to embodiment 38, wherein said first functional sub-regions relate to memory and/or graphical processing unit circuitry and said second functional sub-regions relate to logic and/or central processing unit circuitry.

39. A set of patterning devices according to any of embodiments 30 to 38, wherein said first features on said at least one first patterning device are arranged outside of a boundary region defined along a boundary of the at least one first patterning device and said second features on said at least one second patterning device are arranged outside of boundary region defined along a boundary of the at least one second patterning device.

40. A set of patterning devices according to embodiment 39, comprising at least one third patterning device having a third pattern for forming connections to connect at least some of said first structures to at least some of said second structures.

41. A method for distributing sets of features across a plurality of patterning devices used in a process of stitched patterning of a first layer on a substrate, the method comprising:

defining a first boundary area on at least one first patterning device configured to be imaged to form corresponding first structures in a first layer on the substrate;

distributing first features for forming the first structures on the at least one first patterning device outside of the first boundary area, defining a second boundary area on at least one second patterning device configured to be imaged to form corresponding second structures in the first layer on the substrate; and distributing second features for forming the second structures on the at least one second patterning device outside of the second boundary area.

42. A method according to embodiment 41, further comprising distributing third features on at least one third patterning device, said third features configured to be imaged to form electrical connections on the substrate in a second layer which connect one or more of said first structures to one or more of said second structures.

43. A method according to embodiment 42, comprising optimally arranging the first features, second features and third features on their respective patterning devices, in terms of optimal exposure routing and/or maximized product density.

44. A method for arranging features on at least one patterning device configured for use in a process of patterning a substrate, the method comprising:
   obtaining a process setting for applying structures onto the substrate corresponding to a first set of said features comprised within a region on the at least one patterning device;
   determining a compatibility of a second set of features with the first set of features based on an expected quality of patterning of the second set of features using the setting of the process; and determining a suitable position of the second set of features on the at least one patterning device based on the determined compatibility.

45. A computer program comprising program instructions operable to perform the method of any of embodiments 1 to 29 or 41 to 44, when run on a suitable apparatus.

46. A non-transient computer program carrier comprising the computer program of embodiment 45.

While the above description describes corrections for a lithographic apparatus/scanner, the determined corrections may also be used for any process and by any integrated circuit (IC) manufacturing apparatus in an IC manufacturing process, e.g., an etch apparatus, which has an effect on the position and/or a dimension of the structures formed within a layer.

The terms "radiation" and "beam" used in relation to the lithographic apparatus encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A method for assigning features into at least first features and second features, the first features being for at least one first patterning device configured for use in a lithographic process to form corresponding first structures on a substrate and the second features being for at least one second patterning device configured for use in a lithographic process to form corresponding second structures on the substrate, wherein the method comprises assigning, by a hardware computer system, the features into the first features and the second features,
   wherein a decision of which features are assigned to first features and which features are assigned to second features is based on an expected quality of patterning of the first structures and the second structures based on a corresponding process setting, and
   wherein the first features correspond to one or more first functional sub-regions having a first intended function corresponding to a particular circuit or metrology target, and the second features correspond to one or more second functional sub-regions having a second intended function corresponding to a particular circuit or metrology target, the first intended function being different than the second intended function and the at least one first patterning device not having one or more functional sub-regions having the second intended function and/or the at least second patterning device not having one or more functional sub-regions having the first intended function.

2. The method as claimed in claim 1, further comprising: performing an assessment of the expected quality of patterning of the first structures and the second structures based on the corresponding process setting; and performing the assignment of the features based on the assessment.

3. The method as claimed in claim 2, wherein the performing the assessment comprises simulating patterning of the first structures and the second structures onto a substrate.

4. The method as claimed in claim 2, wherein the assessment is based on imposed design rules for the first features and second features.

5. The method as claimed in claim 2, wherein the assessment is based on a degree of regularity of subsets of the features.

6. The method as claimed in claim 1, wherein the process setting relates to an illumination and/or a patterning process setting.

7. The method as claimed in claim 1, wherein the process setting comprises one or more selected from: an illumination profile, a polarization setting, a focus setting, a dose setting, an etch setting and/or a post-bake exposure setting.

8. The method as claimed in claim 1, wherein the process setting relates to one or more selected from: an alignment sensor setting, a metrology strategy, a metrology setting, a control model, and/or an optical processing control setting.

9. The method as claimed in claim 1, further comprising arranging the first features on the at least one first patterning device in the one or more first functional sub-regions, and the second features on the at least one second patterning device in the one or more second functional sub-regions.

10. The method as claimed in claim 1, wherein the one or more first functional sub-regions relate to memory or graphical processing unit circuitry and the one or more second functional sub-regions relate to logic or central processing unit circuitry.

11. The method as claimed in claim 1, comprising arranging the first features on the at least one first patterning device outside of a boundary region defined along a boundary of the at least one first patterning device and arranging the second features on the at least one second patterning device outside of a boundary region defined along a boundary of the at least one second patterning device.

12. The method as claimed in claim 1, further comprising:
using the at least one first patterning device to form first structures in a first layer on a first sub-field on the substrate in a first patterning process; and
using the at least one second patterning device to form second structures in the first layer on a second sub-field on the substrate in a second patterning process,
wherein at least one process setting is varied between the first patterning process and the second patterning process, and
wherein the first sub-field and second sub-field comprise substantially adjacent sub-fields.

13. A set of patterning devices, comprising:
at least one first patterning device comprising first features configured for use in a lithographic process to form corresponding first structures on a substrate; and
at least one second patterning device comprising second features configured for use in a lithographic process to form corresponding second structures on a substrate,
wherein the first and second features are assigned according to the method of claim 1.

14. A non-transient computer program carrier comprising instructions therein, that when executed by a computing system, are configured to cause the computing system to at least:
assign features into at least first features and second features, the first features being for at least one first patterning device configured for use in a lithographic process to form corresponding first structures on a substrate and the second features being for at least one second patterning device configured for use in a lithographic process to form corresponding second structures on the substrate,
wherein a decision of which features are assigned into the first features and which features are assigned into the second features is based on an expected quality of patterning of the first structures and the second structures based on a corresponding process setting, and
wherein the first features correspond to one or more first functional sub-regions having a first intended function corresponding to a particular circuit or metrology target, and the second features correspond to one or more second functional sub-regions having a second intended function corresponding to a particular circuit or metrology target, the first intended function being different than the second intended function and the at least one first patterning device not having one or more functional sub-regions having the second intended function and/or the at least second patterning device not having one or more functional sub-regions having the first intended function.

15. The computer program carrier as claimed in claim 14, wherein the instructions are further configured to cause the computing system to:
perform an assessment of the expected quality of patterning of the first structures and the second structures based on the corresponding process setting; and
perform the assignment of the features based on the assessment.

16. The computer program carrier as claimed in claim 15, wherein the instructions configured to cause the computing system to perform the assessment are further configured to cause the computing system to simulate patterning of the first structures and the second structures onto a substrate.

17. The computer program carrier as claimed in claim 14, wherein the instructions are further configured to cause the computer system to arrange the first features on the at least one first patterning device outside of a boundary region defined along a boundary of the at least one first patterning device and arrange the second features on the at least one second patterning device outside of a boundary region defined along a boundary of the at least one second patterning device.

18. A set of patterning devices comprising:
at least two first patterning devices comprising first features configured for use in a lithographic process to form corresponding first structures on a substrate; and
at least one second patterning device comprising second features configured for use in a lithographic process to form corresponding second structures on a substrate,
wherein the first features form a first pattern and the second features form a second pattern, the first and second patterns being complementary patterns for forming a layer of a device, and
wherein the decision of which features were assigned to first features and which features were assigned to second features was based on an expected quality of patterning of the first structures and the second structures based on a corresponding process setting, and
wherein the first features correspond to one or more first functional sub-regions having a first intended function corresponding to a particular circuit or metrology target, and the second features correspond to one or more second functional sub-regions having a second intended function corresponding to a particular circuit or metrology target, the first intended function being different than the second intended function and the at least two first patterning devices not having one or more functional sub-regions having the second intended function and/or the at least second patterning device not having one or more functional sub-regions having the first intended function.

19. The set of patterning devices according to claim 18, wherein the process setting relates to an illumination and/or patterning step setting.

20. The set of patterning devices according to claim 19, wherein the illumination and/or patterning step setting comprises one or more selected from: an illumination profile, a polarization setting, a focus setting or a dose setting.

* * * * *